United States Patent
Wei et al.

(10) Patent No.: US 12,426,370 B2
(45) Date of Patent: Sep. 23, 2025

(54) DISPLAY PANEL AND DISPLAY DEVICE

(71) Applicants: Wuhan Tianma Microelectronics Co., Ltd., Wuhan (CN); Wuhan Tianma Microelectronics Co., Ltd. Shanghai Branch, Shanghai (CN)

(72) Inventors: Qibing Wei, Wuhan (CN); Shuai Yang, Wuhan (CN); Peng Zhang, Wuhan (CN); Kang Yang, Wuhan (CN); Yuantao Wu, Wuhan (CN)

(73) Assignees: Wuhan Tianma Microelectronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 578 days.

(21) Appl. No.: 17/858,541

(22) Filed: Jul. 6, 2022

(65) Prior Publication Data
US 2022/0344374 A1 Oct. 27, 2022

(30) Foreign Application Priority Data
Dec. 27, 2021 (CN) .......................... 202111619301.9

(51) Int. Cl.
| | |
|---|---|
| H10D 86/60 | (2025.01) |
| G01R 31/28 | (2006.01) |
| H01L 21/66 | (2006.01) |
| H01L 23/00 | (2006.01) |
| H10D 86/40 | (2025.01) |

(52) U.S. Cl.
CPC ......... *H10D 86/60* (2025.01); *G01R 31/2884* (2013.01); *H01L 22/32* (2013.01); *H01L 24/05* (2013.01); *H01L 24/06* (2013.01); *H10D 86/441* (2025.01); *H01L 2224/05022* (2013.01); *H01L 2224/05073* (2013.01); *H01L 2224/06155* (2013.01)

(58) Field of Classification Search
CPC .. H10D 86/60; H10D 86/441; G01R 31/2884; H01L 22/32; H01L 24/05; H01L 24/06; H01L 2224/05022; H01L 2224/05073; H01L 2224/06155
See application file for complete search history.

(56) References Cited

FOREIGN PATENT DOCUMENTS

| CN | 104880840 B | 1/2018 |
|---|---|---|
| CN | 109102771 A | 12/2018 |
| CN | 109671757 A | 4/2019 |
| CN | 111883034 A | 11/2020 |

*Primary Examiner* — Fernando L Toledo
*Assistant Examiner* — Shawn Shaw Muslim
(74) *Attorney, Agent, or Firm* — KDW FIRM PLLC

(57) ABSTRACT

Provided are a display panel and a display device. A peripheral circuit region is provided with a first pad group, a second pad group and multiple first signal lines. The first pad group includes a plurality of first pads, and the second pad group includes a plurality of second pads. An end of each of the plurality of the first signal lines adjacent to the first side is electrically connected to a respective one of the plurality of first pads, and an end of each of the plurality of the first signal lines adjacent to the second side is electrically connected to a respective one of the plurality of second pads.

22 Claims, 16 Drawing Sheets

DISPLAY PANEL AND DISPLAY DEVICE

CROSS-REFERENCE TO RELATED APPLICATION

This application claims priority to Chinese Patent Application No. 202111619301.9 filed Dec. 27, 2021, the disclosure of which is incorporated herein by reference in its entirety.

TECHNICAL FIELD

The present disclosure relates to the field of display technologies and, in particular, to a display panel and a display device.

BACKGROUND

With the development of science and technology, more and more electronic devices with a display function are widely applied to and bring great convenience for people's daily life and work. Such devices have now become indispensable and important tools for people.

Before a display panel is delivered, a visual test (VT) is performed on the display panel. Only a display panel with a normal image display will be subjected to the next process to be bonded to a flexible circuit board.

SUMMARY

The present disclosure provides a display panel and a display device to reduce voltage drops in the center of the display panel and improve the phenomenon of a black screen in the center of the display panel during a test.

In a first aspect, embodiments of the present disclosure provide a display panel including a display region and a peripheral circuit region disposed at the periphery of the display region. The display panel includes a first side and a second side opposite to each other.

The peripheral circuit region is provided with at least one first pad group, at least one second pad group, and a plurality of first signal lines. Each of the first pad group includes a plurality of first pads, and each of the at least one second pad group includes a plurality of second pads. An end of each of the plurality of first signal lines adjacent to the first side is electrically connected to a respective one of the plurality of first pads, and an end of each of the plurality of first signal lines adjacent to the second side is electrically connected to a respective one of the plurality of second pads.

The peripheral circuit region is further provided with at least one first additional pad group, each of the at least one first additional pad group includes a plurality of first additional pads, and each of the plurality of first additional pads is electrically connected to a respective one of the plurality of the first signal lines.

A vertical distance between each of the at least one first additional pad group and the first side is greater than a vertical distance between each of the at least one first pad group and the first side. A vertical distance between each of the at least one first additional pad group and the second side is greater than a vertical distance between the second pad group and the second side.

In a second aspect, an embodiment of the present disclosure provides a display device including the display panel described in the first aspect.

DETAILED DESCRIPTION

Figure 1:
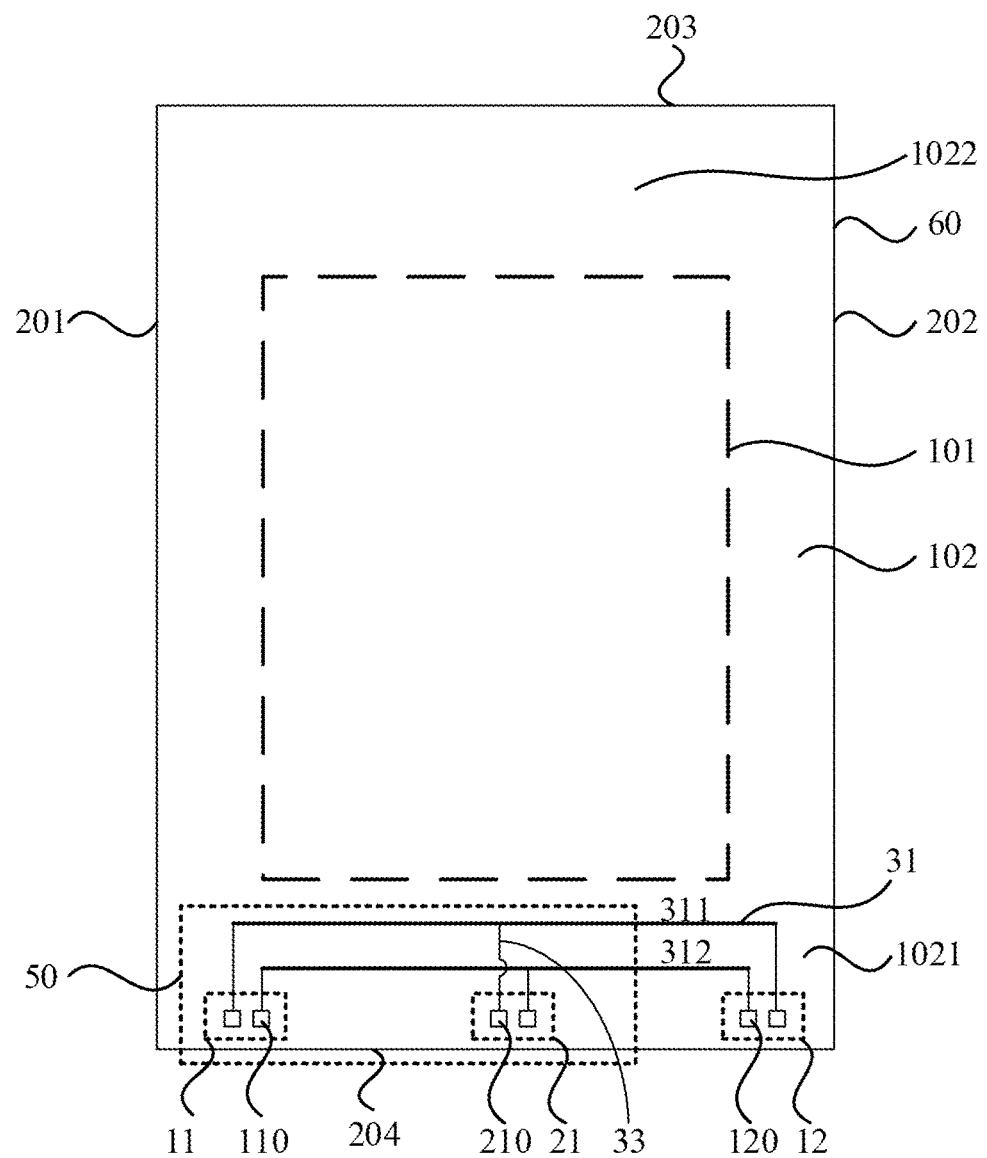
FIG. 1 is a top view of a display panel according to an embodiment of the present disclosure.

The present disclosure is further described below in detail in conjunction with drawings and embodiments. It is to be understood that the embodiments set forth below are intended to merely illustrate the present disclosure and not to limit the present disclosure. Additionally, it is also to be noted that for convenience of description, merely part, not all of, the structures related to the present disclosure are illustrated in the drawings.

Test pads are disposed on the left and right lower steps of a display panel, and a test voltage is provided to the display panel through the test pads. As a distance increases, a voltage drop increases. The voltage drop is smaller at a position closer to an edge of the display panel. The voltage drop is greater at a position closer to the center of the display panel, thereby easily causing a black screen in the center of the display panel.

Figure 2:
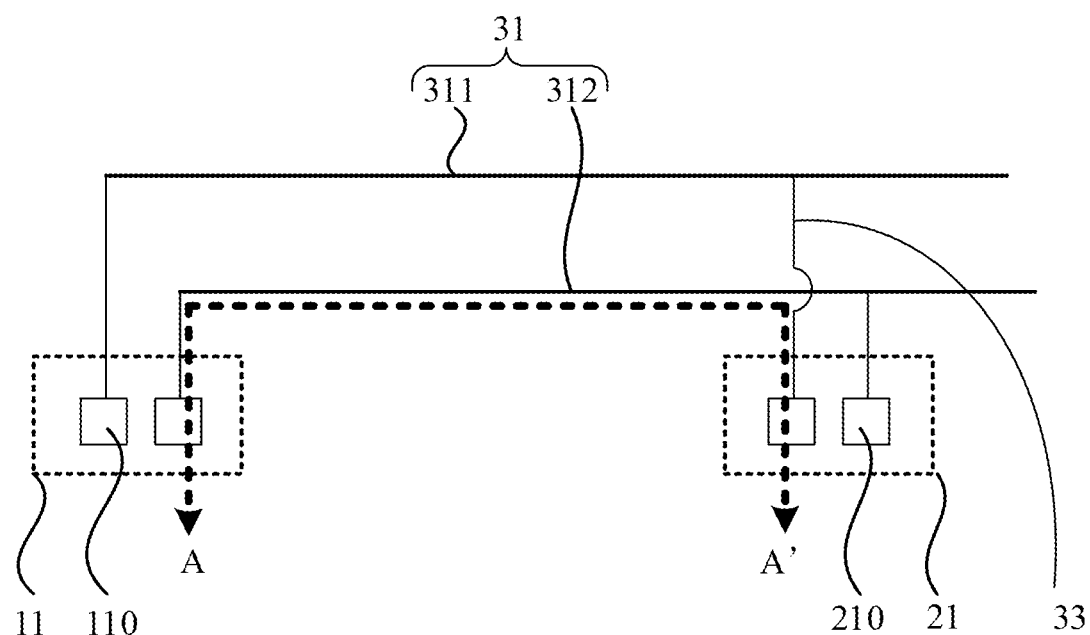
FIG. 2 is an enlarged view of region 50 in FIG. 1.

FIG. 1 is a top view of a display panel according to an embodiment of the present disclosure. FIG. 2 is an enlarged view of region 50 in FIG. 1. Referring to FIGS. 1 and 2, a display panel includes a display region 101 and a peripheral circuit region 102 disposed at the periphery of the display region 101. The display region 101 includes multiple pixel units for displaying an image. The display panel includes a first side 201 and a second side 202 opposite to each other. The peripheral circuit region 102 is provided with at least one first pad group 11, at least one second pad group 12, and multiple first signal lines 31. The first pad group 11 is disposed adjacent to the first side 201, and the second pad group 12 is disposed adjacent to the second side 202. The first pad group 11 includes multiple first pads 110, and the second pad group 12 includes multiple second pads 120. An end of each first signal line 31 adjacent to the first side 201 is electrically connected to a respective one of the multiple first pads 110, and an end of each first signal line 31 adjacent to the second side 202 is electrically connected to a respective one of the multiple second pads 120.

Exemplarily, the multiple first signal lines 31 include a first sub-signal line 311 and a second sub-signal line 312, both of which extend along a direction in which the first side 201 points to the second side 202. Two ends of the first sub-signal line 311 are electrically connected to one first pad 110 and one second pad 120, respectively. Two ends of the second sub-signal line 312 are electrically connected to another first pad 110 and another second pad 120, respectively.

The peripheral circuit region 102 is further provided with at least one first additional pad group 21, each first additional pad group 21 includes multiple first additional pads 210, and the first signal lines 31 are respectively electrically connected to the first additional pads 210. A vertical distance between each first additional pad group 21 and the first side 201 is greater than a vertical distance between the first pad group 11 and the first side 201. A vertical distance between each first additional pad group 21 and the second side 202 is greater than a vertical distance between the second pad group 12 and the second side 202.

The embodiment of the present disclosure provides the display panel. One end of the first signal line 31 is electrically connected to the first pad 110, and the other end of the first signal line 31 is electrically connected to the second pad 120. The peripheral circuit region 102 is further provided with at least one first additional pad group 21. The at least one first additional pad group 21 is disposed between the first pad group 11 and the second pad group 12 along the direction in which the first side 201 points to the second side 202. A certain position in the middle of the first signal line 31 is electrically connected to the first additional pad 210 in the first additional pad group 21. The first additional pad 210 provides an electric signal to the certain position in the middle of the first signal line 31, thereby reducing voltage drops in directions in which the first side 201 and the second side 202 face the center of the display panel and improving the phenomenon of a black screen in the center of the display panel during a test.

Figure 3:
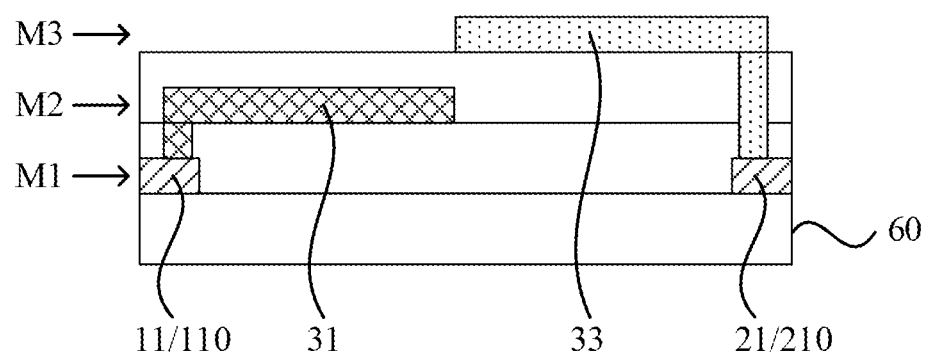
FIG. 3 is a sectional view taken along an AA' direction in FIG. 2.

FIG. 3 is a sectional view taken along an AA' direction in FIG. 2. Referring to FIGS. 1 to 3, the display panel further includes a substrate 60 on which the first pad group 11, the second pad group 12, the first additional pad group 21, and the first signal lines 31 are all disposed. The first pad group 11, the second pad group 12 and the first additional pad group 21 are all disposed in a first metal layer M1. That is, the first metal layer M1 is patterned by etching to form the first pad group 11, the second pad group 12, and the first additional pad group 21. The first signal lines 31 are disposed in a signal line layer M2. That is, the signal line layer M2 is patterned by etching to form the first signal lines 31. The first metal layer M1 is disposed between the substrate 60 and the signal line layer M2 along a direction perpendicular to the substrate 60. A vertical distance between the substrate 60 and any one of the first pad group 11, the second pad group 12 and the first additional pad group 21 is less than a vertical distance between the first signal line 31 and the substrate 60.

The display panel further includes multiple connection lines 33. One end of each connection line 33 is electrically connected to a respective first signal line 31. The other end of each connection line 33 is electrically connected to a respective first additional pad 210. The first signal line 31 is electrically connected to the first additional pad 210 through the connection line 33. The multiple connection lines 33 are disposed in a line changing layer M3. Along the direction perpendicular to the substrate 60, the line changing layer M3 is disposed on a side of the first metal layer M1 facing away from the substrate 60. The vertical distance between the substrate 60 and any one of the first pad group 11, the second pad group 12 and the first additional pad group 21 is less than a vertical distance between the connection line 33 and the substrate 60. The line changing layer M3 is a layer different from the signal line layer M2 so that the first signal line 31 and the connection line 33 are prevented from being electrically connected to each other through an intersection in the same layer, and the connection line 33 is prevented from electrically connecting two first signal lines 31 to each other.

Exemplarily, the first sub-signal line 311 is electrically connected to the first additional pad 210 through one connection line 33. The connection line 33 electrically connected to the first sub-signal line 311 intersects with the second sub-signal line 312. The line changing layer M3 is the layer different from the signal line layer M2. Thus, the connection line 33 electrically connected to the first sub-signal line 311 is prevented from being electrically connected to the second sub-signal line 312.

Optionally, referring to FIG. 3, along the direction perpendicular to the substrate 60, the line changing layer M3 is disposed on a side of the signal line layer M2 facing away from the substrate 60. A vertical distance between the first signal line 31 and the substrate 60 is less than a vertical distance between the connection line 33 and the substrate 60.

Figure 4:
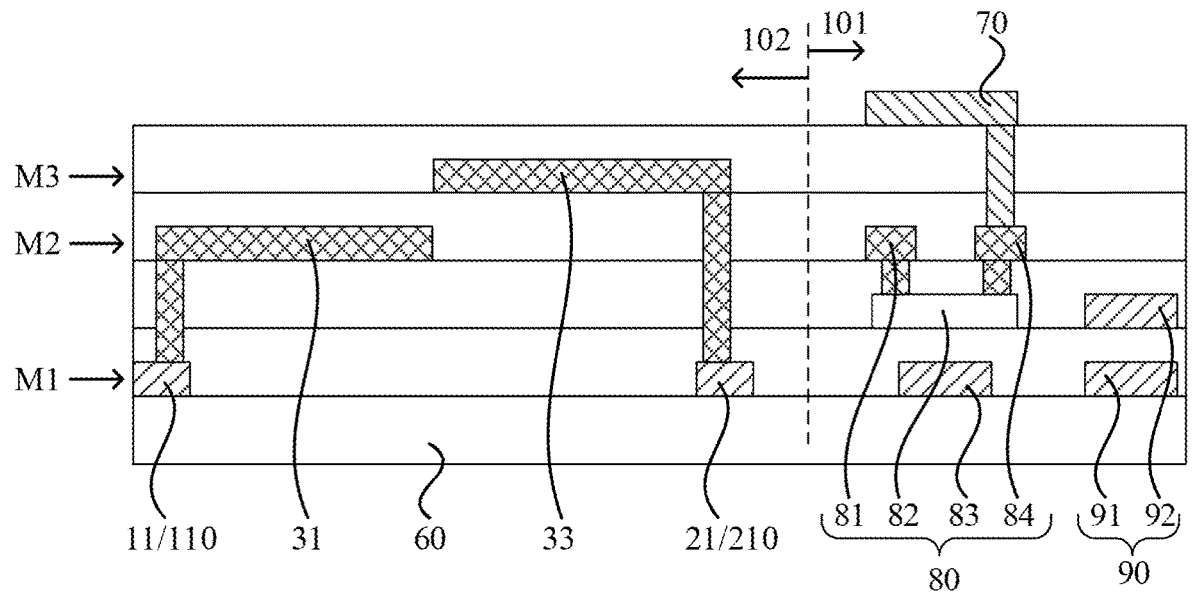
FIG. 4 is a sectional view of another display panel according to an embodiment of the present disclosure.

FIG. 4 is a sectional view of another display panel according to an embodiment of the present disclosure. Referring to FIG. 4, the display panel further includes an anode 70, also referred to as a pixel electrode. A voltage difference formed between the anode 70 and a common electrode (not shown in FIG. 7) drives pixel units to emit light. The line changing layer M3 is disposed between the signal line layer M2 and the anode 70 along the direction perpendicular to the substrate 60.

Exemplarily, referring to FIG. 4, the display panel includes a thin-film transistor (TFT) 80 and a storage capacitor 90. The TFT 80 includes a gate 83, a source 81, a drain 84, and a semiconductor layer 82. The storage capacitor 90 includes a first plate 91 and a second plate 92. The anode 70 is disposed on a side of the TFT 80 facing away from the substrate 60 and electrically connected to the drain 84 of the TFT 80. The gate 83 of the TFT 80 and the first plate 91 of the storage capacitor 90 are both disposed in the first metal layer M1. The gate 83 of the TFT 80, the first plate 91 of the storage capacitor 90, the first pad group 11, the second pad group 12, and the first additional pad group 21 are disposed in the same layer. The source 81 and the drain 84 of the TFT 80 are disposed in the signal line layer M2 and both disposed in the same layer as the first signal line 31. The first signal line 31 may be made of the same material as the source 81 and the drain 84 of the TFT 80 to reduce a resistivity of the first signal line 31 and a voltage drop on the first signal line 31. The line changing layer M3 is disposed between the signal line layer M2 and the anode 70. The line changing layer M3 is a metal layer added between the TFT 80 and the anode 70 to reduce a resistivity of the connection line 33 and reduce a voltage drop on the connection line 33.

Figure 5:
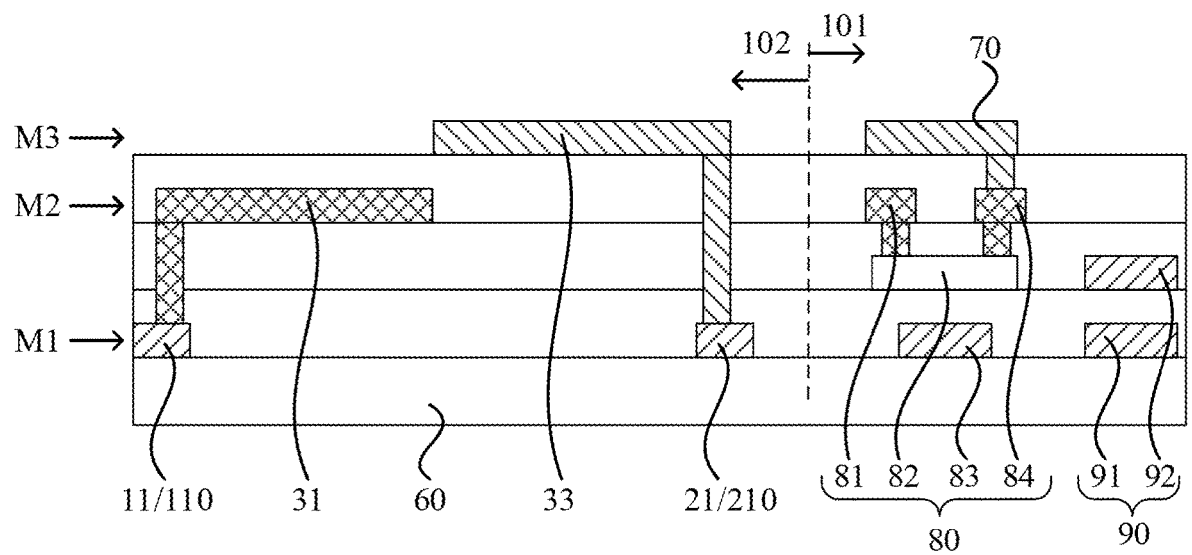
FIG. 5 is a sectional view of another display panel according to an embodiment of the present disclosure.

FIG. 5 is a sectional view of another display panel according to an embodiment of the present disclosure. Referring to FIG. 5, the anode 70 is disposed in the line changing layer M3. The anode 70 is disposed in the same layer as the connection line 33 so that the thickness of the display panel is not increased. On the other hand, the anode 70 and the connection line 33 are disposed in the same layer so that when the anode 70 is formed, the connection line 33 may be formed in the same process and made of the same material, thereby saving a manufacturing process.

Figure 6:
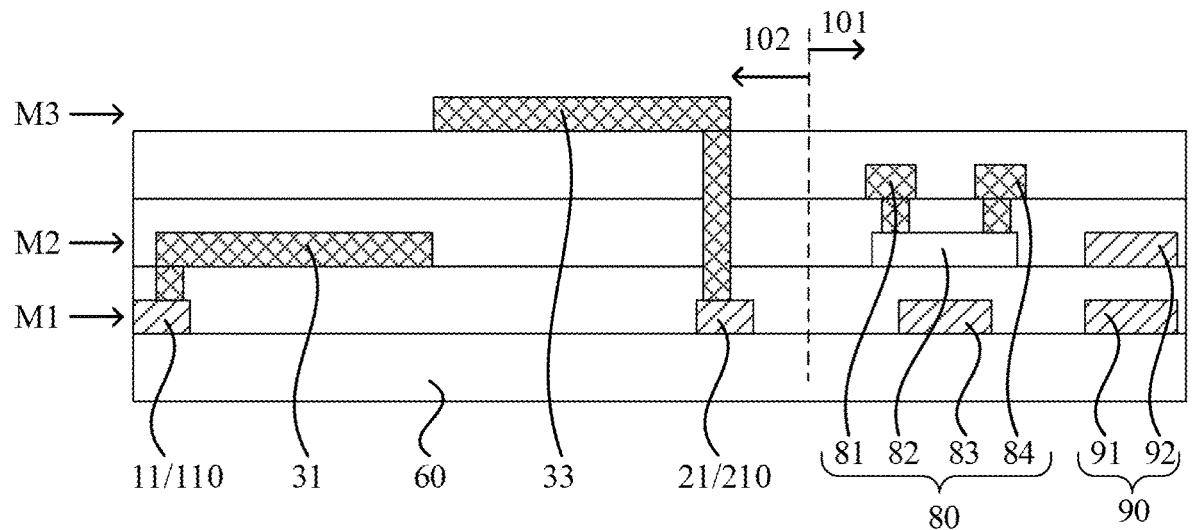
FIG. 6 is a sectional view of another display panel according to an embodiment of the present disclosure.

FIG. 6 is a sectional view of another display panel according to an embodiment of the present disclosure. Referring to FIG. 6, the gate 83 of the TFT 80, the first plate 91 of the storage capacitor 90, the first pad group 11, the second pad group 12, and the first additional pad group 21 are disposed in the same layer. The second plate 92 of the storage capacitor 90 is disposed in the signal line layer M2 and disposed in the same layer as the first signal line 31. The first signal line 31 may be made of the same material as the second plate 92 of the storage capacitor 90. The connection line 33 is disposed on the side of the TFT 80 facing away from the substrate 60.

Figure 7:
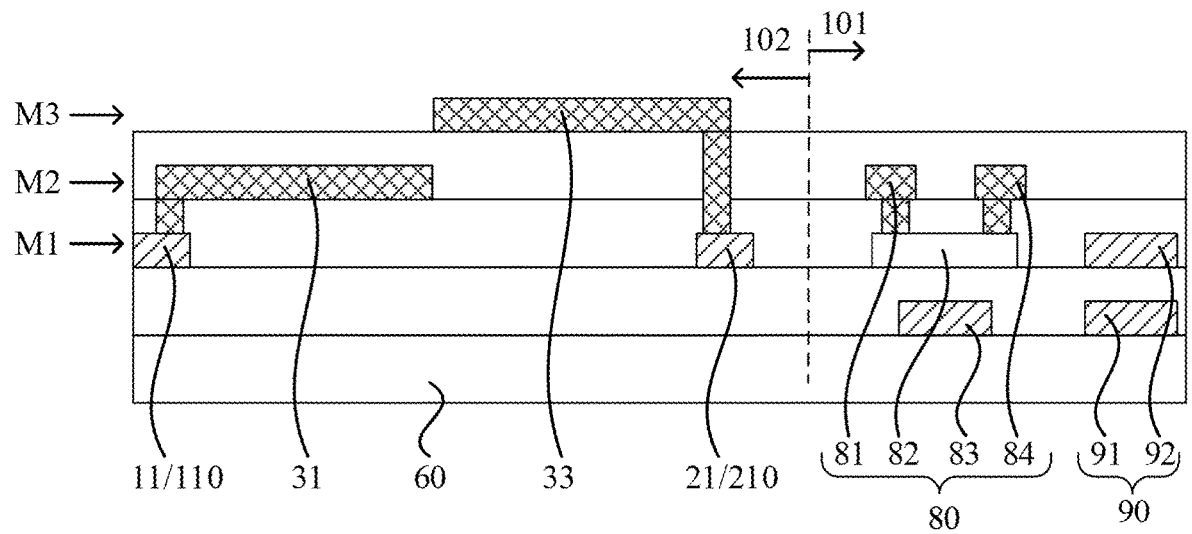
FIG. 7 is a sectional view of another display panel according to an embodiment of the present disclosure.

FIG. 7 is a sectional view of another display panel according to an embodiment of the present disclosure. Referring to FIG. 7, the second plate 92 of the storage capacitor 90 is disposed in the first metal layer M1, and the second plate 92 of the storage capacitor 90, the first pad group 11, the second pad group 12, and the first additional pad group 21 are disposed in the same layer. The first pad group 11, the second pad group 12, and the first additional pad group 21 may be made of the same material as the second plate 92 of the storage capacitor 90. The source 81 and the drain 84 of the TFT 80 are disposed in the same layer as the first signal line 31. The connection line 33 is disposed on the side of the TFT 80 facing away from the substrate 60.

Figure 8:
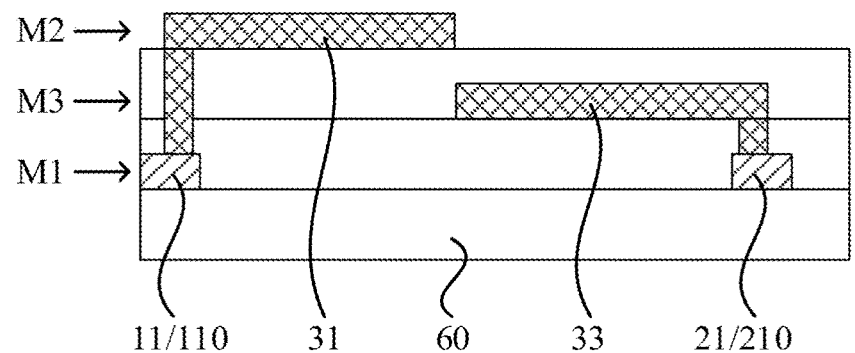
FIG. 8 is a sectional view of another display panel according to an embodiment of the present disclosure.

FIG. 8 is a sectional view of another display panel according to an embodiment of the present disclosure. Referring to FIG. 8, the line changing layer M3 is disposed between the first metal layer M1 and the signal line layer M2 along the direction perpendicular to the substrate 60. The vertical distance between the first signal line 31 and the substrate 60 is greater than the vertical distance between the connection line 33 and the substrate 60.

Figure 9:
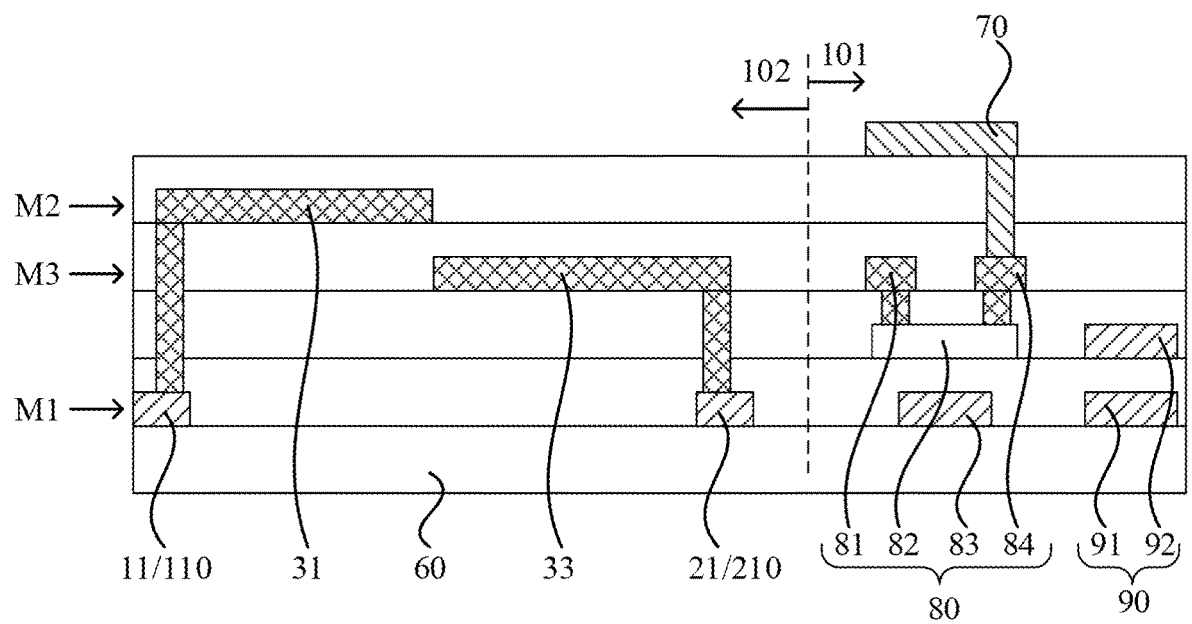
FIG. 9 is a sectional view of another display panel according to an embodiment of the present disclosure.

FIG. 9 is a sectional view of another display panel according to an embodiment of the present disclosure. The signal line layer M2 is disposed between the line changing layer M3 and the anode 70 along the direction perpendicular to the substrate 60.

Exemplarily, referring to FIG. 9, the gate 83 of the TFT 80, the first plate 91 of the storage capacitor 90, the first pad group 11, the second pad group 12, and the first additional pad group 21 are disposed in the same layer. The source 81 and the drain 84 of the TFT 80 are disposed in the line changing layer M3 and both disposed in the same layer as the connection line 33. The connection line 33 may be made of the same material as the source 81 and the drain 84 of the TFT 80 to reduce the resistivity of the connection line 33 and the voltage drop on the connection line 33. The signal line layer M2 is disposed between the line changing line layer M3 and the anode 70. The line changing layer M2 is the metal layer added between the TFT 80 and the anode 70 to reduce the resistivity of the first signal line 31 and reduce the voltage drop on the first signal line 31.

Figure 10:
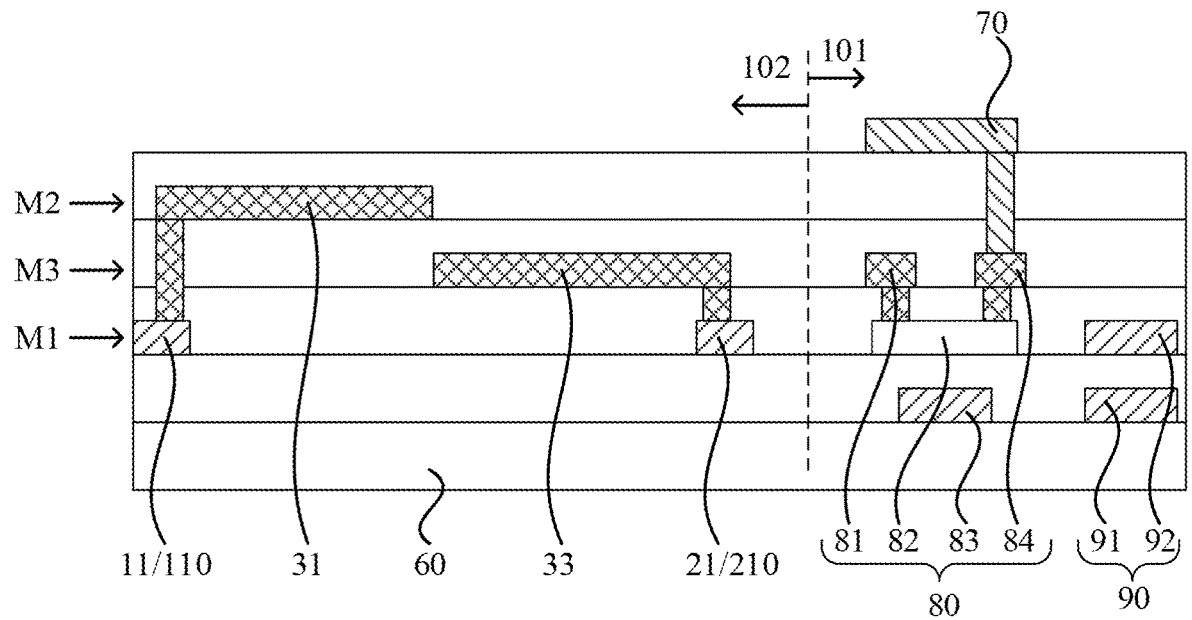
FIG. 10 is a sectional view of another display panel according to an embodiment of the present disclosure.

FIG. 10 is a sectional view of another display panel according to an embodiment of the present disclosure. Referring to FIG. 10, the second plate 92 of the storage capacitor 90, the first pad group 11, the second pad group 12, and the first additional pad group 21 are disposed in the same layer. The source 81 and the drain 84 of the TFT 80 are disposed in the same layer as the connection line 33. The first signal line 31 is disposed between the TFT 80 and the anode 70.

Figure 11:
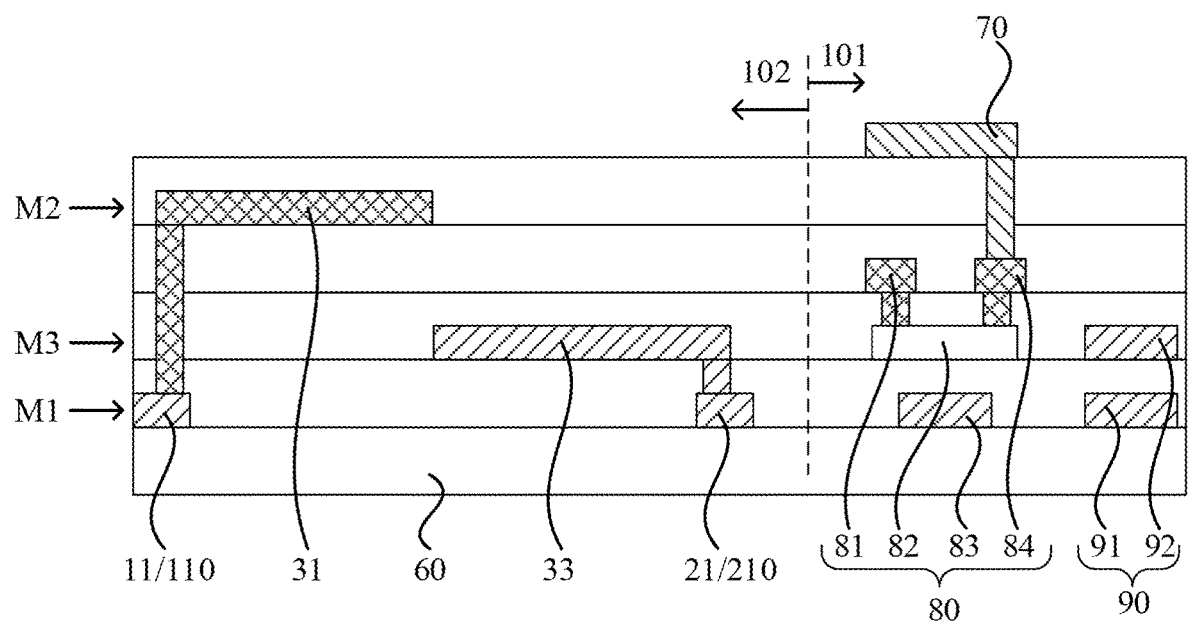
FIG. 11 is a sectional view of another display panel according to an embodiment of the present disclosure.

FIG. 11 is a sectional view of another display panel according to an embodiment of the present disclosure. Referring to FIG. 11, the gate 83 of the TFT 80, the first plate 91 of the storage capacitor 90, the first pad group 11, the second pad group 12, and the first additional pad group 21 are disposed in the same layer. The second plate 92 of the storage capacitor 90 is disposed in the same layer as the connection line 33. The first signal line 31 is disposed between the TFT 80 and the anode 70.

Figure 12:
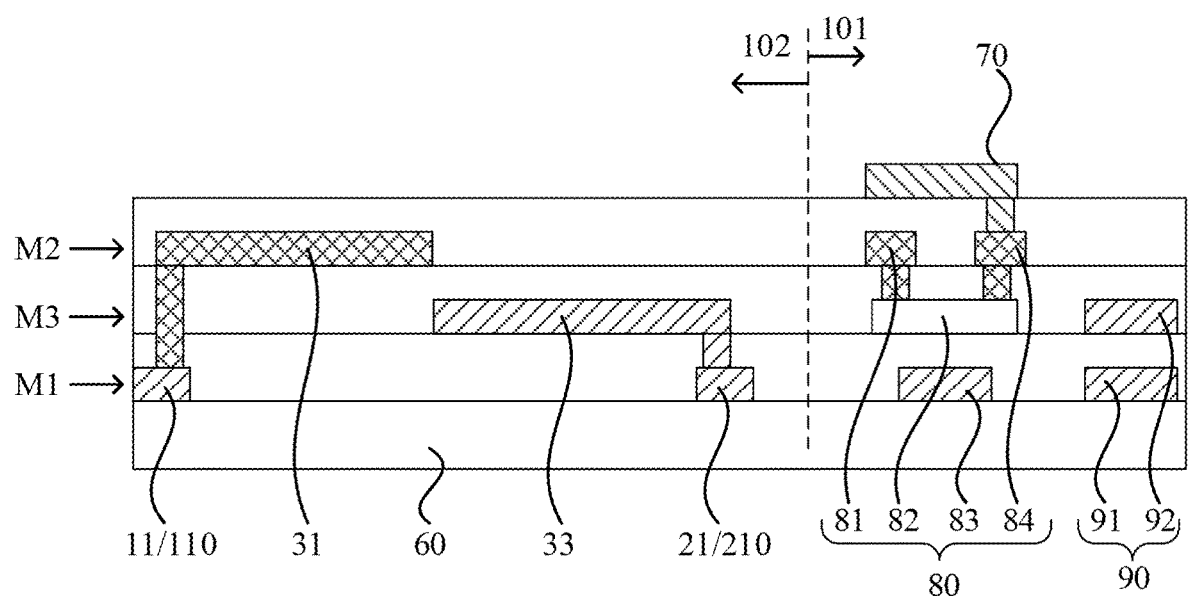
FIG. 12 is a sectional view of another display panel according to an embodiment of the present disclosure.

FIG. 12 is a sectional view of another display panel according to an embodiment of the present disclosure. Referring to FIG. 12, the gate 83 of the TFT 80, the first plate 91 of the storage capacitor 90, the first pad group 11, the second pad group 12, and the first additional pad group 21 are disposed in the same layer. The second plate 92 of the storage capacitor 90 is disposed in the same layer as the connection line 33. The source 81 and the drain 84 of the TFT 80 are disposed in the same layer as the first signal line 31.

Optionally, with continued reference to FIG. 1, the peripheral circuit region 102 includes a step region 1021. The step region 1021 may be provided with a bonding pad group (not shown in FIG. 1). A driver chip and/or a flexible circuit board is bonded to the display panel and electrically connected to bonding pads in the bonding pad group. The first signal lines 31, the first pad group 11, the second pad group 12, and the first additional pad group 21 are all disposed in the step region 1021.

Exemplarily, referring to FIG. 1, the display panel further includes a third side 203 and a fourth side 204 opposite to each other. The third side 203 connects the first side 201 to the second side 202, and the fourth side 204 connects the first side 201 to the second side 202. The first signal lines 31, the first pad group 11, the second pad group 12, and the first additional pad group 21 are disposed adjacent to the fourth side 204.

Figure 13:
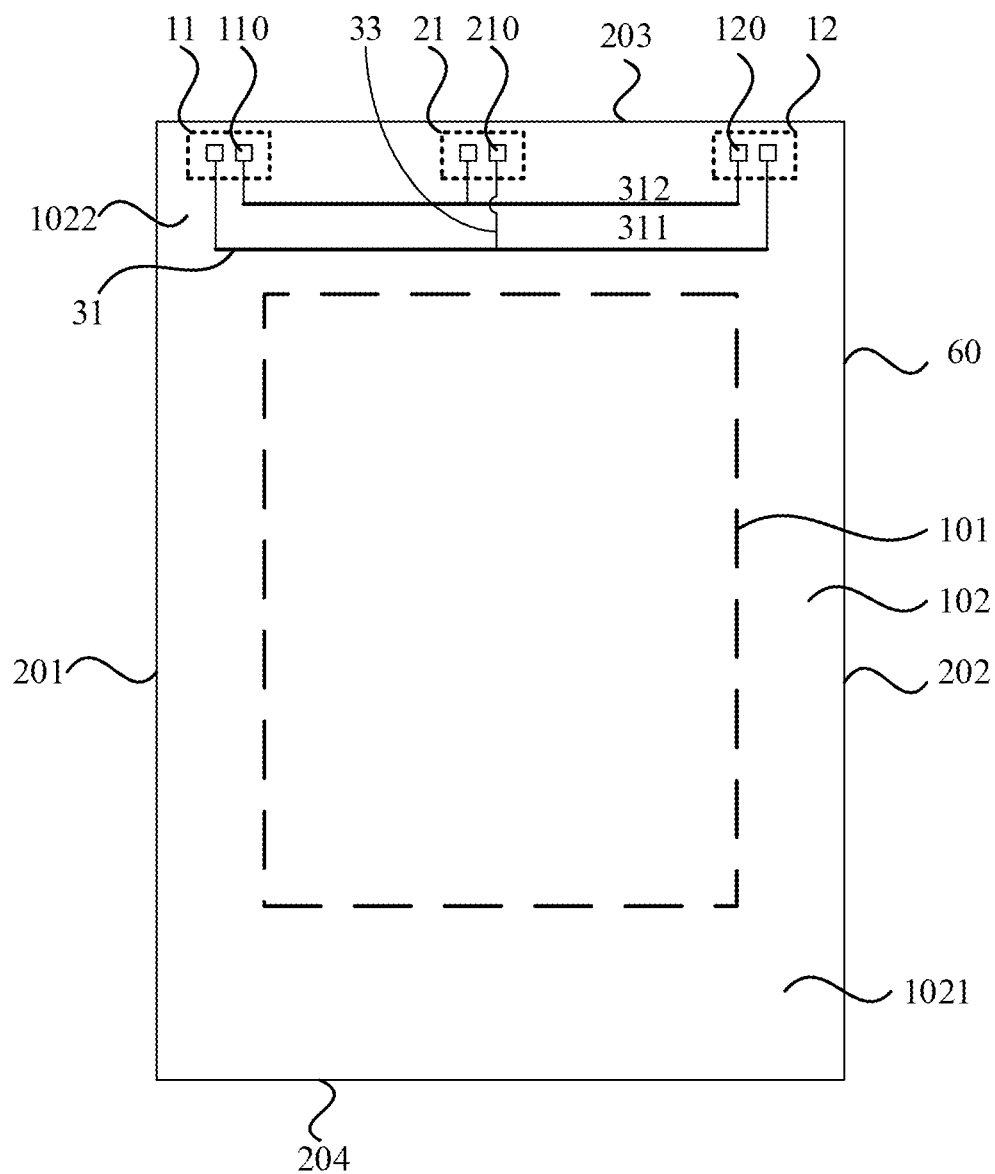
FIG. 13 is a top view of another display panel according to an embodiment of the present disclosure.

FIG. 13 is a top view of another display panel according to an embodiment of the present disclosure. Referring to FIG. 13, the peripheral circuit region 102 includes the step region 1021 and a step opposite side region 1022. The step region 1021 is opposite to the step opposite side region 1022. The display region 101 is disposed between the step region 1021 and the step opposite side region 1022. The first signal lines 31, the first pad group 11, the second pad group 12, and the first additional pad group 21 are all disposed in the step opposite side region 1022.

Exemplarily, referring to FIG. 13, the first signal lines 31, the first pad group 11, the second pad group 12, and the first additional pad group 21 are disposed adjacent to the third side 203.

Figure 14:
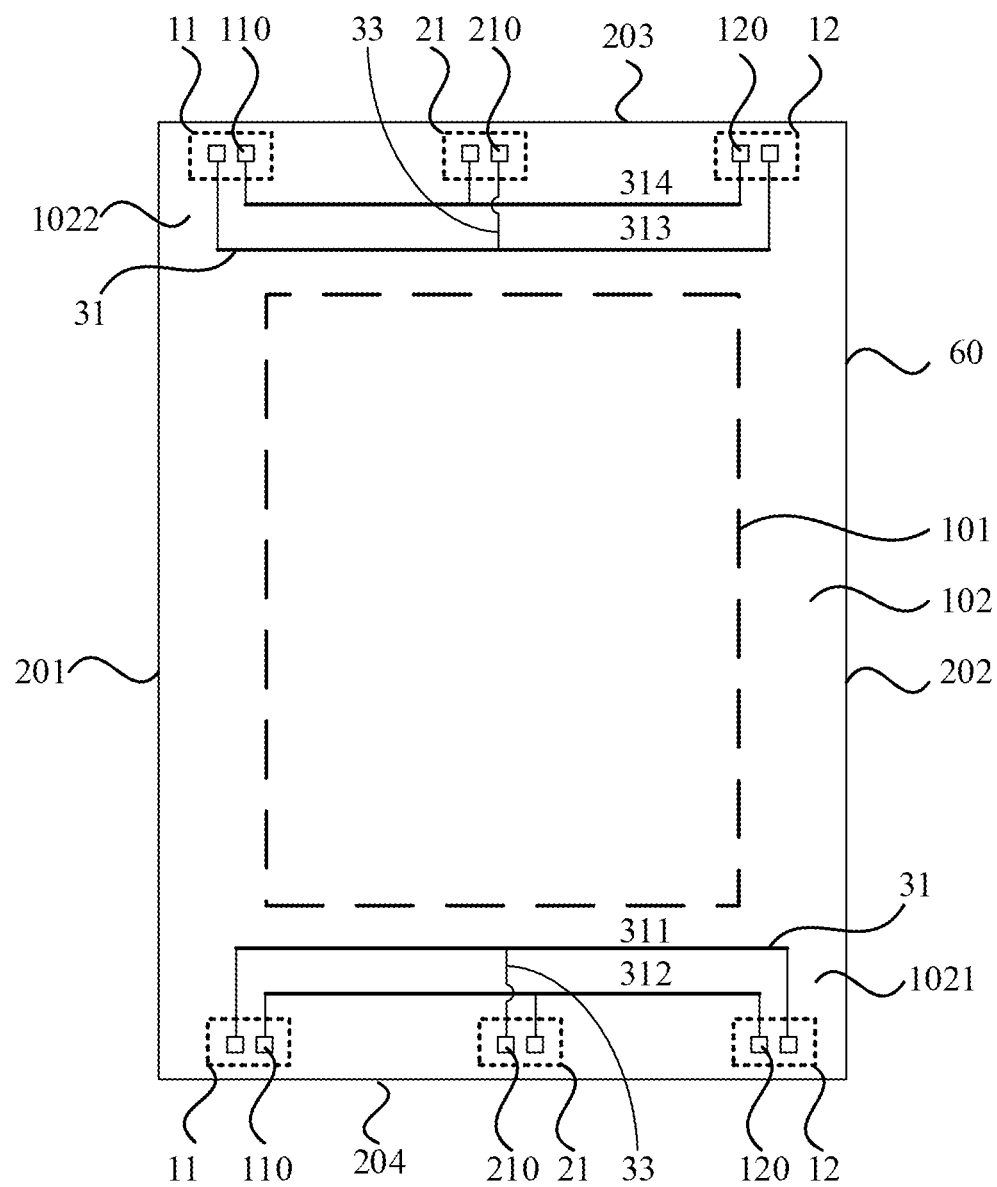
FIG. 14 is a top view of another display panel according to an embodiment of the present disclosure.

FIG. 14 is a top view of another display panel according to an embodiment of the present disclosure. Referring to FIG. 14, the display panel includes two first pad groups 11, two second pad groups 12, and at least two first additional pad groups 21. One part of multiple first signal lines 31, one first pad group 11, one second pad group 12, and at least one first additional pad group 21 are disposed in the step region 1021. The other part of multiple first signal lines 31, the other first pad group 11, the other second pad group 12, and at least one first additional pad group 21 are disposed in the step opposite side region 1022. In the embodiment of the present disclosure, the multiple first signal lines 31 are disposed in the step region 1021 and the step opposite side region 1022. With respect to the first signal lines 31 in the step region 1021, the one first pad group 11, the one second pad group 12, and the at least one first additional pad group 21 are disposed correspondingly. With respect to the first signal lines 31 in the step opposite side region 1022, the other first pad group 11, the other second pad group 12, and the at least one first additional pad group 21 are disposed correspondingly.

Exemplarily, referring to FIG. 14, the multiple first signal lines 31 include the first sub-signal line 311, the second sub-signal line 312, a third sub-signal line 313 and a fourth sub-signal line 314. The first sub-signal line 311 and the second sub-signal line 312 are disposed in the step region 1021. The third sub-signal line 313 and the fourth sub-signal line 314 are disposed in the step opposite side region 1022.

Optionally, referring to FIGS. 13 and 14, when the display panel is cut, the first signal lines 31, the first pad group 11, the second pad group 12, and the first additional pad group 21 disposed in the step opposite side region 1022 are cut and removed so that after the display panel is cut, the first signal lines 31, the first pad group 11, the second pad group 12, and the first additional pad group 21 do not occupy a space of the step opposite side region 1022, thereby reducing an area of the step opposite side region 1022 and reducing a bezel of the display panel.

Figure 15:
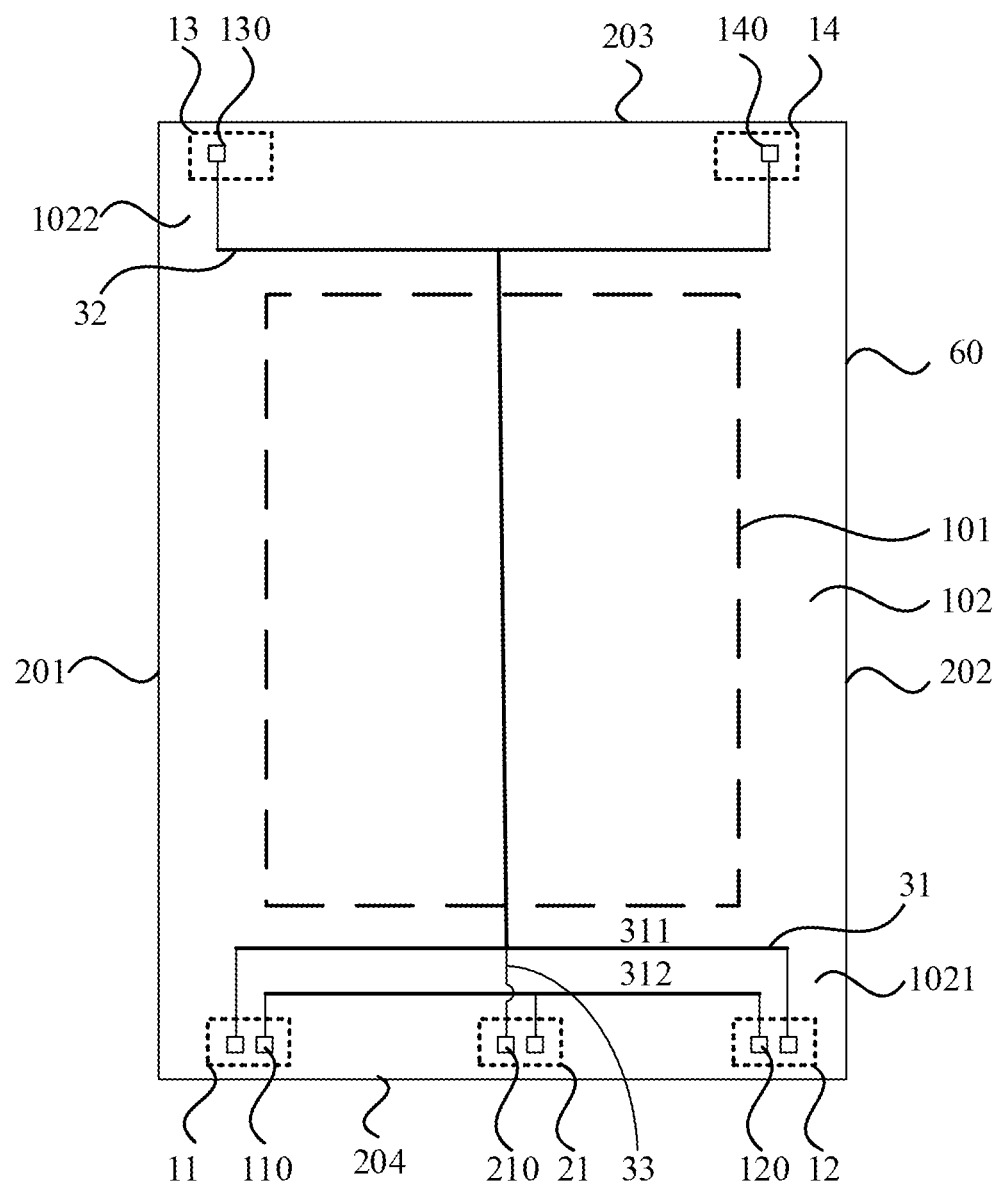
FIG. 15 is a top view of another display panel according to an embodiment of the present disclosure.

FIG. 15 is a top view of another display panel according to an embodiment of the present disclosure. Referring to FIG. 15, the display panel further includes at least one second signal line 32, at least one third pad group 13 and at least one fourth pad group 14. The third pad group 13 includes at least one third pad 130, and the fourth pad group 14 includes at least one fourth pad 140. At least part of the multiple first signal lines 31 are disposed in the step region 1021. The at least one second signal line 32 is disposed in the step opposite side region 1022. An end of the second signal line 32 adjacent to the first side 201 is electrically connected to one third pad 130, and an end of the second signal line 32 adjacent to the second side 202 is electrically connected to one fourth pad 140. Two ends of the second signal line 32 are electrically connected to the third pad 130 and the fourth pad 140, respectively. At least one first signal line 31 and the second signal line 32 transmit the same electric signal. In the embodiment of the present disclosure, the second signal line 32 is added to the step opposite side region 1022. The first signal lines 31 and the second signal line 32 on two sides of the display region 101 provide the same electric signal to the display region 101, thereby improving a drive capability of the display panel, reducing voltage drops in directions in which the third side 203 and the fourth side 204 face the center of the display panel, and improving the phenomenon of the black screen in the center of the display panel during the test.

Exemplarily, the at least one second signal line 32 may be disposed in the same layer as the first signal lines 31, formed in the same process, and made of the same material. The first pad group 11, the second pad group 12, the third pad group 13, and the fourth pad group 14 are disposed in the same layer, formed in the same process, and made of the same material.

Figure 16:
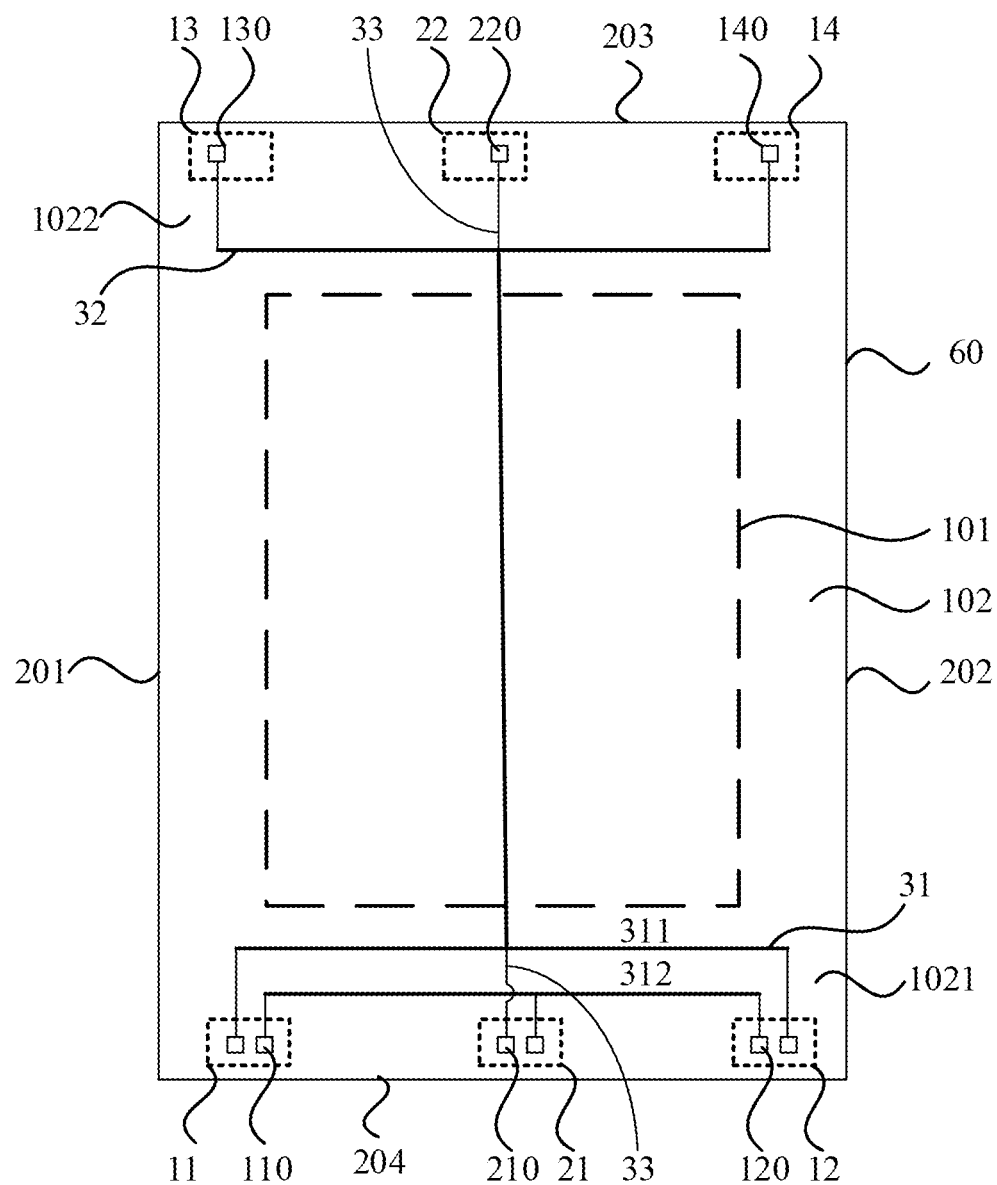
FIG. 16 is a top view of another display panel according to an embodiment of the present disclosure.

FIG. 16 is a top view of another display panel according to an embodiment of the present disclosure. Referring to FIG. 16, the step opposite side region 1022 is further provided with at least one second additional pad group 22. Each second additional pad group 22 includes at least one second additional pad 220. Each second additional pad 220 is electrically connected to a respective second signal line 32. A vertical distance between the second additional pad group 22 and the first side 201 is greater than a vertical distance between the third pad group 13 and the first side 201. A vertical distance between the second additional pad group 22 and the second side 202 is greater than a vertical distance between the fourth pad group 14 and the second side 202. In the embodiment of the present disclosure, one end of the second signal line 32 is electrically connected to the third pad 130, and the other end of the second signal line 32 is electrically connected to the fourth pad 140. The step opposite side region 1022 is provided with the at least one second additional pad group 22. The at least one second additional pad group 22 is disposed between the third pad group 13 and the fourth pad group 14 along the direction in which the first side 201 points to the second side 202. A certain position in the middle of the second signal line 32 is electrically connected to the second additional pad 220 in the second additional pad group 22. The second additional pad 220 provides the electric signal to the certain position in the middle of the second signal line 32, thereby reducing voltage drops in the center of the display panel and improving the phenomenon of the black screen in the center of the display panel during the test.

Optionally, referring to FIG. 16, the first signal line 13 includes a constant voltage signal line, and a voltage on the constant voltage signal line is a constant value. A constant voltage value is provided to the display region 101 through the first signal line 31. The constant voltage signal line is typically configured to provide a supply voltage, and generates a relatively large current, resulting in generation of a relatively large voltage drop. Thus, the phenomenon of the black screen in the center of the display panel occurs more easily during the test. In this case, the first additional pad group 21 provided by the embodiment of the present disclosure is particularly needed to reduce the voltage drops in directions in which the first side 201 and the second side 202 face the center of the display panel and improve the phenomenon of the black screen in the center of the display panel during the test.

Optionally, referring to FIG. 16, the first signal lines 31 may include a switch control signal line and a test signal line. The switch control signal line is configured to provide a switch control signal. For example, the switch control signal line is electrically connected to the gate of the TFT for controlling the turn-on and turn-off of the TFT. The test signal line is configured to provide a test signal. For example, the test signal line is configured to provide an R test signal, a G test signal and a B test signal. The R test signal, the G test signal and the B test signal are respectively configured to light up a red pixel unit, a green pixel unit and a blue pixel unit in the display region 101.

Optionally, referring to FIG. 16, the at least one second signal line 32 includes a constant voltage signal line, and a voltage on the constant voltage signal line is a constant value. Since the constant voltage signal line is typically configured to provide a supply voltage, a relatively large voltage drop is generated. The at least one second signal line 32 added by the embodiment of the present disclosure is particularly needed. The first signal lines 31 and the at least one second signal line 32 on the two sides of the display region 101 provide the same electric signal to the display region 101, thereby reducing the voltage drops in directions in which the third side 203 and the fourth side 204 face the center of the display panel and improving the phenomenon of the black screen in the center of the display panel during the test.

Optionally, the constant voltage signal line includes at least one of a reference voltage signal line, a positive power signal line, a negative power signal line, a high level signal line or a low level signal line. The reference voltage signal line is configured to provide a reference voltage, the positive power voltage line is configured to provide a positive power voltage, and the negative power signal line is configured to provide a negative power voltage.

Optionally, referring to FIG. 16, when the display panel is cut, the second signal line 32, the third pad group 13, the fourth pad group 14, and the second additional pad group 22 disposed in the step opposite side region 1022 are cut and removed so that after the display panel is cut, the second signal line 32, the third pad group 13, the fourth pad group 14, and the second additional pad group 22 do not occupy the space of the step opposite side region 1022, thereby reducing the area of the step opposite side region 1022 and reducing the bezel of the display panel.

Figure 17:
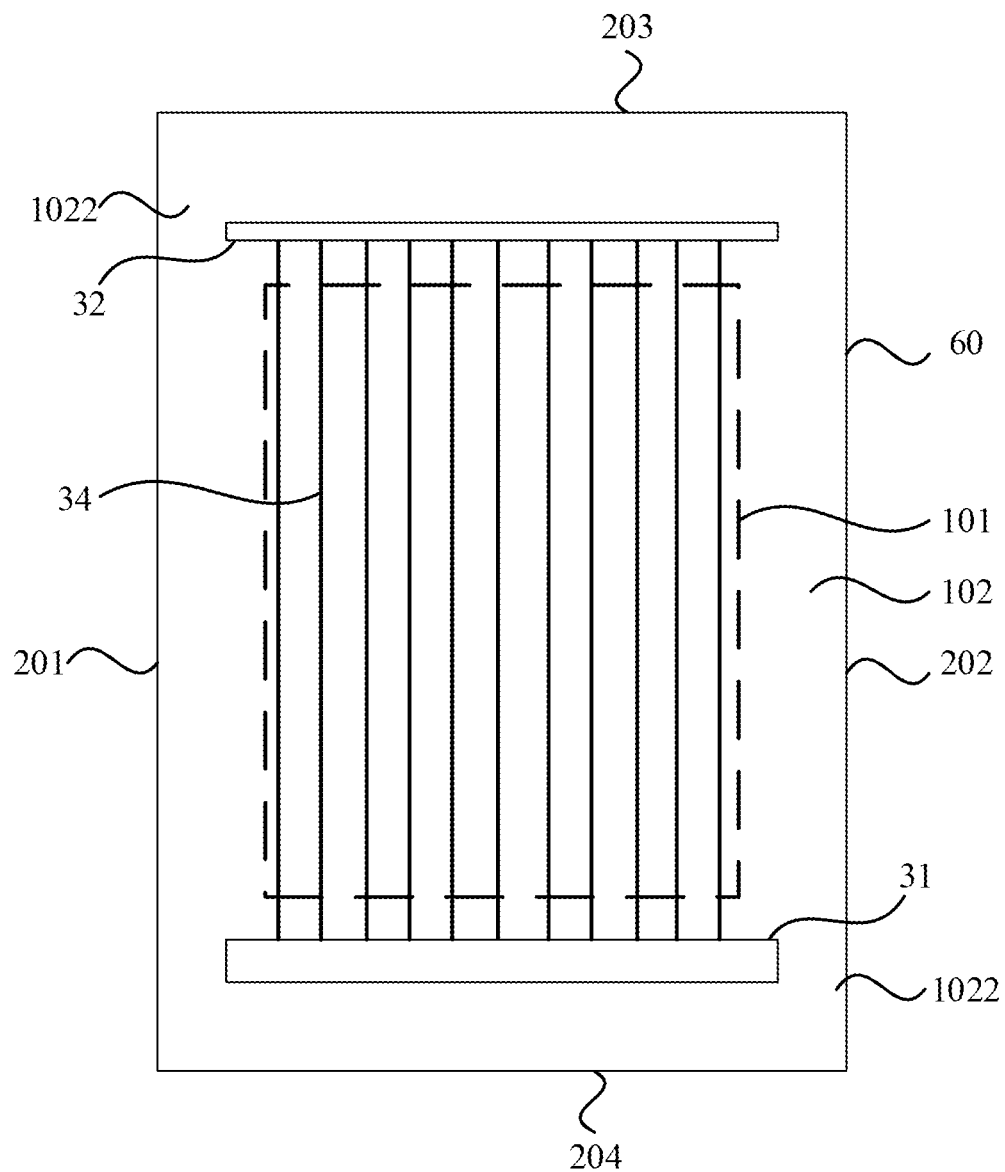
FIG. 17 is a top view of another display panel according to an embodiment of the present disclosure.

FIG. 17 is a top view of another display panel according to an embodiment of the present disclosure. Referring to FIG. 17, the first signal line 31 and the second signal line 32 each include the constant voltage signal line. The constant voltage signal line includes the reference voltage signal line. The display panel further includes multiple reference voltage branch lines 34 extending from the display region 101 to the peripheral circuit region 102. The multiple reference voltage branch lines 34 are electrically connected to the reference voltage signal line and arranged along the direction in which the first side 201 points to the second side 202. In the embodiment of the present disclosure, the multiple reference voltage branch lines 34 are electrically connected to the first signal line 31 and/or the second signal line 32. Electric signals provided to the display region 101 through the first signal line 31 and/or the second signal line 32 are provided to the display region 101 by the multiple reference voltage branch lines 34 arranged along the direction in which the first side 201 points to the second side 202, thereby reducing the voltage drops in the directions in which the first side 201 and the second side 202 face the center of the display panel and improving the phenomenon of the black screen in the center of the display panel during the test.

Figure 18:
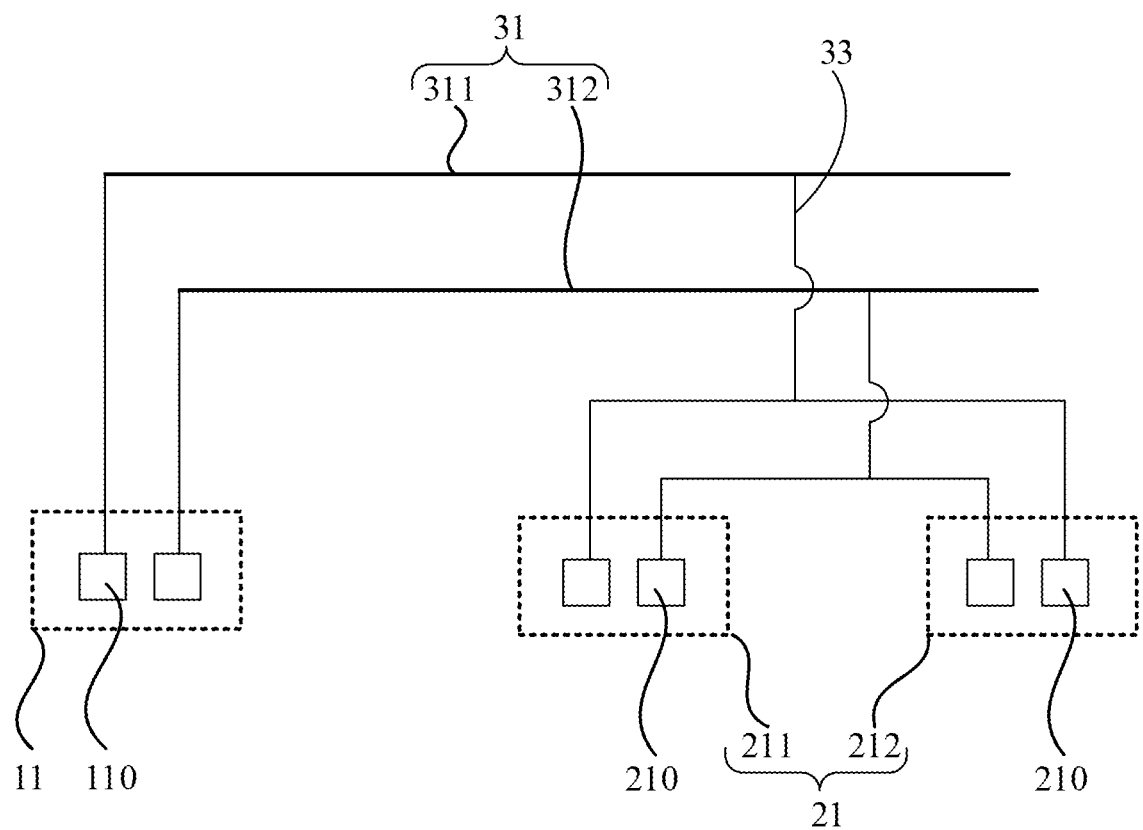
FIG. 18 is a top view of a partial region of another display panel according to an embodiment of the present disclosure.

FIG. 18 is a top view of a partial region of another display panel according to an embodiment of the present disclosure. Referring to FIG. 18, the first additional pad group 21 includes two sub-pad groups, and first additional pads 210 in the two sub-pad groups are connected to the same connection point on the first signal line 31.

Exemplarily, the two sub-pad groups are denoted as a first sub-pad group 211 and a second sub-pad group 212, respectively. One connection point on the first signal line 31 is electrically connected to one first additional pad 210 in the first sub-pad group 211 and one first additional pad 210 in the second sub-pad group 212.

Figure 19:
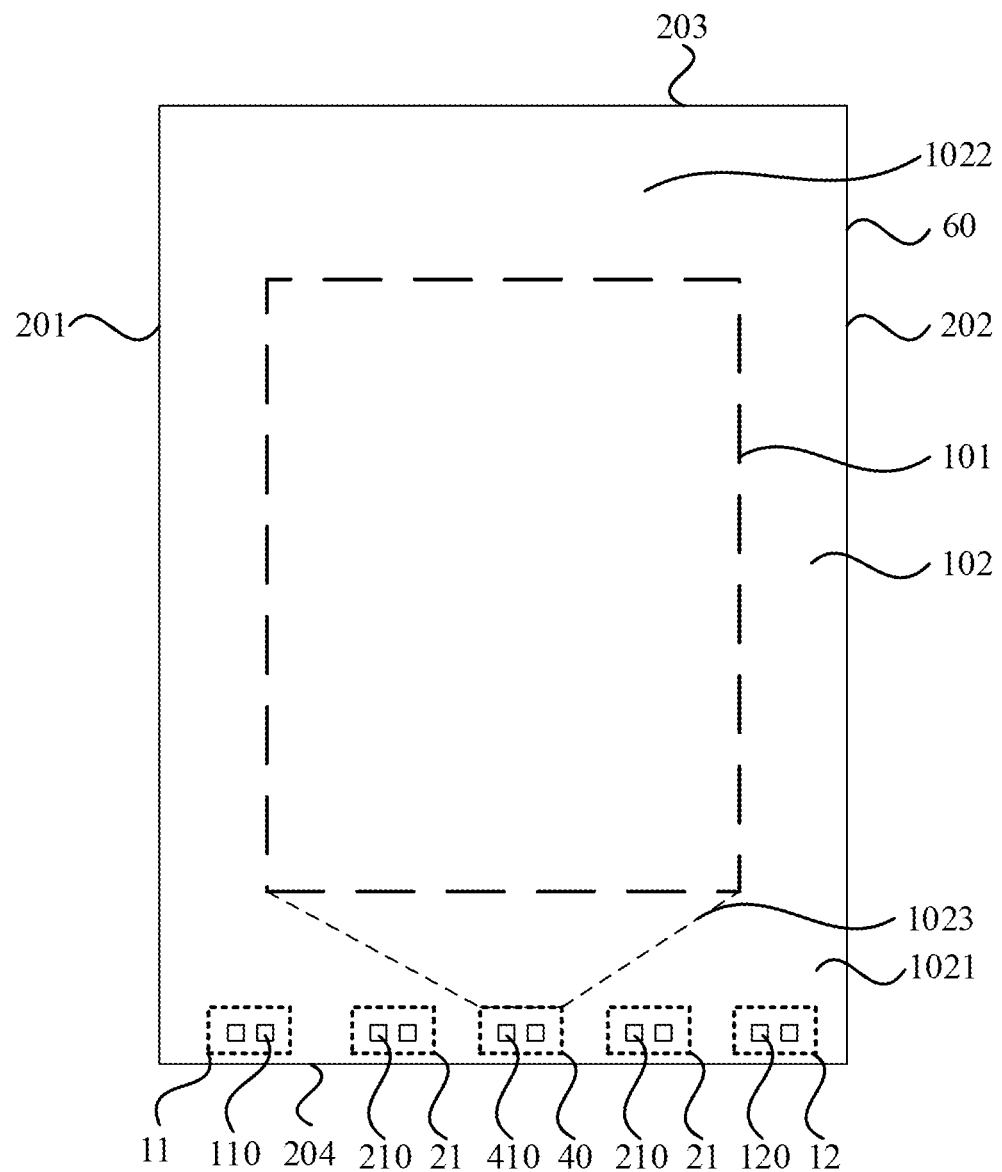
FIG. 19 is a top view of another display panel according to an embodiment of the present disclosure.

FIG. 19 is a top view of another display panel according to an embodiment of the present disclosure. The peripheral circuit region 102 is further provided with a bonding pad group 40 including multiple bonding pads 410. At least one first additional pad group 21 is disposed between the first pad group 11 and the bonding pad group 40 along the direction in which the first side 201 points to the second side 202. At least one first additional pad group 21 is disposed between the second pad group 12 and the bonding pad group 40.

In other embodiments, it is also feasible that a first additional pad group 21 is disposed merely between the first pad group 11 and the bonding pad group 40, or a first additional pad group 21 is disposed merely between the second pad group 12 and the bonding pad group 40.

Exemplarily, referring to FIG. 19, the step region 1021 includes a sector region 1023 in which sector wires may be disposed for electrically connecting bonding pads 410 to signal lines in the display region 101. The display panel shown in FIG. 19 is provided with one sector 1023. In other embodiments, a display panel having a relatively large area needs to be provided with at least two sectors 1023. The display panel having the relatively large area may be, for example, a computer display screen, a vehicle-mounted display screen, a display screen, or the like.

Figure 20:
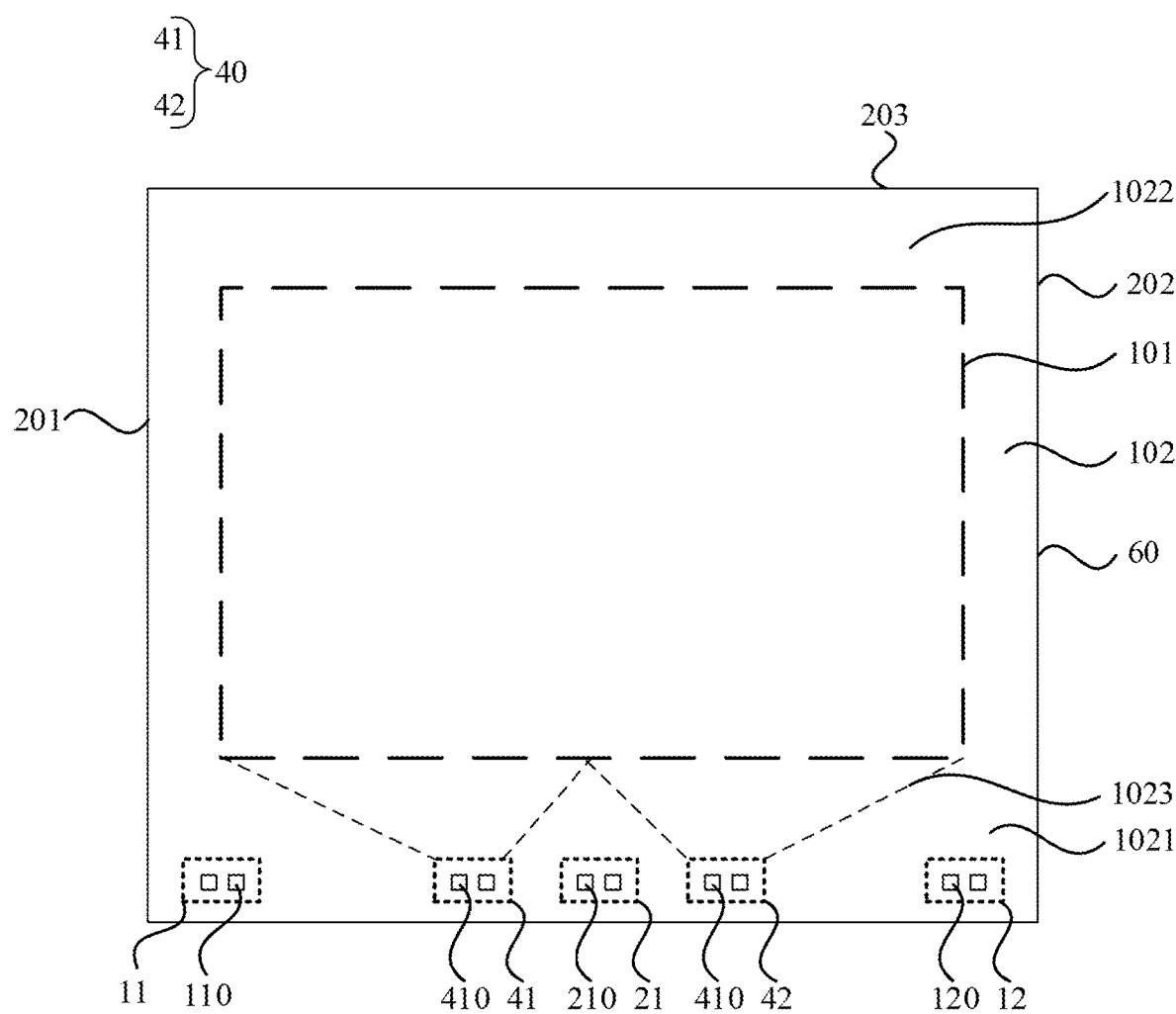
FIG. 20 is a top view of another display panel according to an embodiment of the present disclosure.

FIG. 20 is a top view of another display panel according to an embodiment of the present disclosure. Referring to FIG. 20, the peripheral circuit region 102 includes two bonding pad groups 40 which are a first bonding pad group 41 and a second bonding pad group 42, respectively. The first bonding pad group 41 and the second bonding pad group 42 each include multiple bonding pads 410. The first bonding pad group 41 is electrically connected to a sector wire in one sector region 1023, and the second bonding pad group 42 is electrically connected to a sector wire in the other sector region 1023. A region between the first bonding pad group 41 and the second bonding pad group 42 is relatively distant from the first side 201 and relatively distant from the second side 202. Along the direction in which the first side 201 points to the second side 202, at least one first additional pad group 21 is disposed between the first bonding pad group 41 and the second bonding pad group 42 to reduce the voltage drops in the directions in which the first side 201 and the second side 202 face the center of the display panel and improve the phenomenon of the black screen in the center of the display panel during the test.

Figure 21:
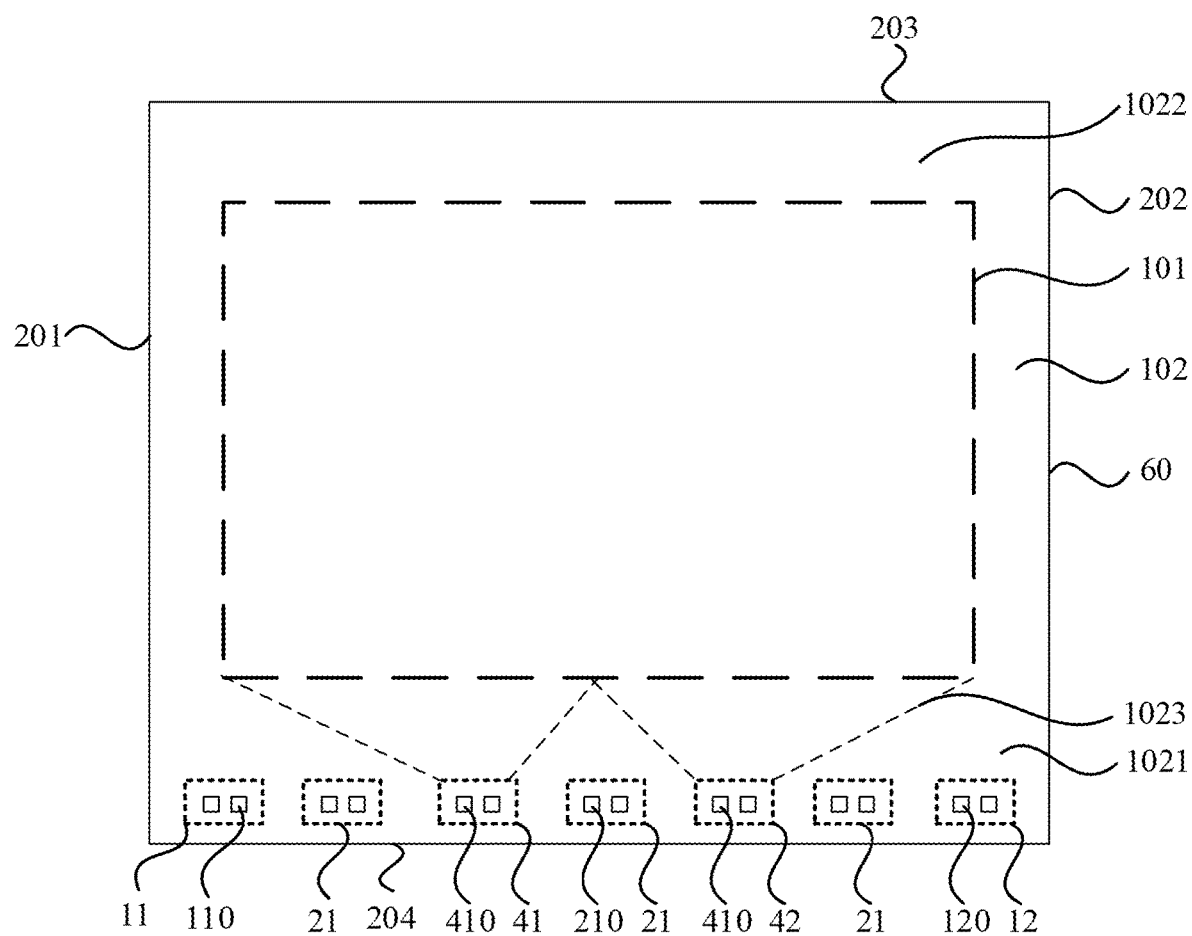
FIG. 21 is a top view of another display panel according to an embodiment of the present disclosure.

FIG. 21 is a top view of another display panel according to an embodiment of the present disclosure. Referring to FIG. 21, along the direction in which the first side 201 points to the second side 202, the first bonding pad group 41 is disposed between the first pad group 11 and the second bonding pad group 42, and the second bonding pad group 42 is disposed between the first bonding pad group 41 and the second side 202. Along the direction in which the first side 201 points to the second side 202, at least one first additional pad group 21 is disposed between the first pad group 11 and the first bonding pad group 41. At least one first additional pad group 21 is disposed between the second pad group 12 and the second bonding pad group 42.

In other embodiments, it is also feasible that at least one first additional pad group 21 is disposed merely between the first pad group 11 and the first bonding pad group 41, or at least one first additional pad group 21 is disposed merely between the second pad group 12 and the second bonding pad group 42.

An embodiment of the present disclosure further provides a display device including the display panel described in the preceding embodiments. The display device may be a computer, a mobile phone, a tablet computer, or the like.

It is to be noted that the preceding are merely preferred embodiments of the present disclosure and the principles used therein. It is to be understood by those skilled in the art that the present disclosure is not limited to the embodiments described herein. Those skilled in the art can make various apparent changes, adaptations, combinations, and substitutions without departing from the scope of the present disclosure. Therefore, although the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:

1. A display panel, comprising: a display region and a peripheral circuit region disposed at a periphery of the display region; and a first side and a second side opposite to each other, wherein the peripheral circuit region is provided with at least one first pad group, at least one second pad group and a plurality of first signal lines, each of the at least one first pad group comprises a plurality of first pads, and each of the at least one second pad group comprises a plurality of second pads; an end of each of the plurality of the first signal lines adjacent to the first side is electrically connected to a respective first pad, and an end of each of the plurality of the first signal lines adjacent to the second side is electrically connected to a respective second pad; wherein the peripheral circuit region is further provided with at least one first additional pad group, each of the at least one first additional pad group comprises a plurality of first additional pads, and each of the plurality of first additional pads is electrically connected to a respective one of the plurality of the first signal lines; and wherein a vertical distance between each of the at least one first additional pad group and the first side is greater than a vertical distance between each of the at least one first pad group and the first side; and a vertical distance between each of the at least one first additional pad group and the second side is greater than a vertical distance between each of the at least one second pad group and the second side;

the display panel further comprises:
a substrate, wherein the at least one first pad group, the at least one second pad group, the at least one first additional pad group and the plurality of first signal lines are all disposed on the substrate, wherein the first at least one pad group, the at least one second pad group and the at least one first additional pad group are all disposed in a first metal layer; the plurality of first signal lines are disposed in a signal line layer; and the first metal layer is disposed between the substrate and the signal line layer along a direction perpendicular to the substrate; and
a plurality of connection lines, wherein one end of each of the plurality of connection lines is electrically connected to a respective one of the plurality of first signal lines, and the other end of each of the plurality of connection lines is electrically connected to a respective one of the plurality of first additional pads; the plurality of connection lines are disposed in a line changing layer; and along the direction perpendicular to the substrate, the line changing layer is disposed on a side of the first metal layer facing away from the substrate and is a layer different from the signal line layer.

2. The display panel according to claim 1, wherein the line changing layer is disposed on a side of the signal line layer facing away from the substrate along the direction perpendicular to the substrate.

3. The display panel according to claim 2, further comprising an anode, wherein the line changing layer is disposed between the signal line layer and the anode along the direction perpendicular to the substrate.

4. The display panel according to claim 2, further comprising an anode disposed in the line changing layer.

5. The display panel according to claim 1, wherein the line changing layer is disposed between the first metal layer and the signal line layer along the direction perpendicular to the substrate.

6. The display panel according to claim 5, further comprising an anode, wherein the signal line layer is disposed between the line changing layer and the anode along the direction perpendicular to the substrate.

7. The display panel according to claim 1, wherein the peripheral circuit region comprises a step region; and the plurality of first signal lines, the at least one first pad group, the at least one second pad group, and the at least one first additional pad group are all disposed in the step region.

8. The display panel according to claim 1, wherein the peripheral circuit region comprises a step region and a step opposite side region, and the step region is opposite to the step opposite side region; and wherein the plurality of first signal lines, the at least one first pad group, the at least one second pad group and the at least one first additional pad group are all disposed in the step opposite side region.

9. The display panel according to claim 1, wherein two first pad groups, two second pad groups and at least two first additional pad groups are provided;
wherein the peripheral circuit region comprises a step region and a step opposite side region, and the step region is opposite to the step opposite side region;
a part of the plurality of first signal lines, one of the two first pad groups, one of the two second pad groups, and at least one of the at least two first additional pad groups are disposed in the step region; and
the other part of the plurality of first signal lines, the other one of the two first pad groups, the other one of the two second pad groups, and at least one of the at least two first additional pad groups are disposed in the step opposite side region.

10. The display panel according to claim 7, further comprising:
at least one second signal line disposed in the step opposite side region;
at least one third pad group comprising at least one third pad; and
at least one fourth pad group comprising at least one fourth pad,
wherein an end of each of the at least one second signal line adjacent to the first side is electrically connected to a respective one of the at least one third pad, and an end of each of the at least one second signal line adjacent to the second side is electrically connected to a respective one of the at least one fourth pad; and at least one of the plurality of first signal lines transmits a same electric signal as the second signal line.

11. The display panel according to claim 10, wherein the step opposite side region is further provided with at least one second additional pad group, each of the at least one second additional pad group comprises at least one second additional pad, and each of the at least one second additional pad is electrically connected to a respective one of the at least one second signal line; and
a vertical distance between each of the at least one second additional pad group and the first side is greater than a vertical distance between each of the at least one third pad group and the first side; and a vertical distance between each of the at least one second additional pad group and the second side is greater than a vertical distance between each of the at least one fourth pad group and the second side.

12. The display panel according to claim 1, wherein the plurality of first signal lines comprise a constant voltage signal line, and a voltage on the constant voltage signal line is a constant value.

13. The display panel according to claim 12, wherein the plurality of first signal lines further comprise a switch control signal line and a test signal line.

14. The display panel according to claim 10, wherein the at least one second signal line comprises a constant voltage signal line, and a voltage on the constant voltage signal line is a constant value.

15. The display panel according to claim 12, wherein the constant voltage signal line comprises at least one of a reference voltage signal line, a positive power signal line, a negative power signal line, a high level signal line or a low level signal line.

16. The display panel according to claim 12, wherein the constant voltage signal line comprises a reference voltage signal line; and
the display panel further comprises a plurality of reference voltage branch lines extending from the display region to the peripheral circuit region, electrically connected to the reference voltage signal line, and arranged along a direction in which the first side points to the second side.

17. The display panel according to claim 8, wherein the plurality of first signal lines, the at least one first pad group, the at least one second pad group, and the at least one first additional pad group disposed in the step opposite side region are cut and removed in response to the display panel being cut.

18. The display panel according to claim 1, wherein each of the at least one first additional pad group comprises two sub-pad groups, and first additional pads in the two sub-pad groups are connected to a same connection point on a respective one of the plurality of first signal lines.

19. The display panel according to claim 1, wherein the peripheral circuit region is further provided with a bonding pad group comprising a plurality of bonding pads; and,
along a direction in which the first side points to the second side, the at least one first additional pad group is disposed between the at least one first pad group and the bonding pad group, and/or the at least one first additional pad group is disposed between the at least one second pad group and the bonding pad group.

20. The display panel according to claim 1, wherein the peripheral circuit region is further provided with a first bonding pad group and a second bonding pad group, the first bonding pad group and the second bonding pad group each comprise a plurality of bonding pads; and
along a direction in which the first side points to the second side, at least one first additional pad group is disposed between the first bonding pad group and the second bonding pad group.

21. The display panel according to claim 20, wherein along the direction in which the first side points to the second side, the first bonding pad group is disposed between the first pad group and the second bonding pad group; and along the direction in which the first side points to the second side, at least one first additional pad group is disposed between the at least one first pad group and the first bonding pad group, and/or at least one first additional pad group is disposed between the at least one second pad group and the second bonding pad group.

22. A display device, comprising a display panel, wherein the display panel comprises: a display region and a peripheral circuit region disposed at a periphery of the display region; and a first side and a second side opposite to each other, wherein the peripheral circuit region is provided with at least one first pad group, at least one second pad group and a plurality of first signal lines, each of the at least one first pad group comprises a plurality of first pads, and each of the at least one second pad group comprises a plurality of second pads; an end of each of the plurality of the first signal lines adjacent to the first side is electrically connected to a respective first pad, and an end of each of the plurality of the first signal lines adjacent to the second side is electrically connected to a respective second pad; wherein the peripheral circuit region is further provided with at least one first additional pad group, each of the at least one first additional pad group comprises a plurality of first additional pads, and each of the plurality of first additional pads is electrically connected to a respective one of the plurality of the first signal lines; and wherein a vertical distance between each of the at least one first additional pad group and the first side is greater than a vertical distance between each of the at least one first pad group and the first side; and a vertical distance between each of the at least one first additional pad group and the second side is greater than a vertical distance between each of the at least one second pad group and the second side;
wherein the display panel further comprises:
a substrate, wherein the at least one first pad group, the at least one second pad group, the at least one first additional pad group and the plurality of first signal lines are all disposed on the substrate, wherein the first at least one pad group, the at least one second pad group and the at least one first additional pad group are all disposed in a first metal layer; the plurality of first signal lines are disposed in a signal line layer; and the first metal layer is disposed between the substrate and the signal line layer along a direction perpendicular to the substrate; and
a plurality of connection lines, wherein one end of each of the plurality of connection lines is electrically connected to a respective one of the plurality of first signal lines, and the other end of each of the plurality of connection lines is electrically connected to a respective one of the plurality of first additional pads; the plurality of connection lines are disposed in a line changing layer; and along the direction perpendicular to the substrate, the line changing layer is disposed on a side of the first metal layer facing away from the substrate and is a layer different from the signal line layer.

* * * * *